(12) United States Patent
Mirow

(10) Patent No.: US 8,183,923 B2
(45) Date of Patent: May 22, 2012

(54) CONSTANT GAIN AMPLIFIER SYSTEM WITH GAIN CONTROL FEEDBACK

(76) Inventor: Fred A Mirow, Lower Merion, PA (US)

( * ) Notice: Subject to any disclaimer, the term of this patent is extended or adjusted under 35 U.S.C. 154(b) by 0 days.

(21) Appl. No.: 12/927,133

(22) Filed: Nov. 8, 2010

(65) Prior Publication Data

US 2011/0121901 A1     May 26, 2011

Related U.S. Application Data

(60) Provisional application No. 61/281,945, filed on Nov. 24, 2009.

(51) Int. Cl.
    *H03G 3/00*     (2006.01)
(52) U.S. Cl. ............................ 330/282; 330/293; 330/85
(58) Field of Classification Search .................. 330/282, 330/293, 85
See application file for complete search history.

(56) References Cited

U.S. PATENT DOCUMENTS

| | | | |
|---|---|---|---|
| 4,124,825 A * | 11/1978 | Webb et al. | 330/279 |
| 6,292,120 B1 * | 9/2001 | Painchaud et al. | 341/139 |
| 6,437,643 B1 * | 8/2002 | Ueno et al. | 330/85 |
| 6,593,812 B2 * | 7/2003 | Sundstrom | 330/136 |
| 6,784,740 B1 * | 8/2004 | Tabatabaei | 330/279 |
| 2004/0051938 A1 * | 3/2004 | Chan et al. | 359/337.1 |

* cited by examiner

*Primary Examiner* — Patricia Nguyen

(57) ABSTRACT

Constant and accurate signal gain systems based on controlling signal amplifier gain level by applying the signal amplifier output signal to a signal level divider with a set ratio. The output signal of the signal level divider is applied to one input of the gain control amplifier, which is a differential amplifier, while the signal amplifier input signal is applied to the other input. The gain control amplifier output level is used to control the gain level of the signal amplifier. The gain control amplifier output level forces by negative feedback the gain control amplifier input levels to be substantially equal thus maintaining the signal amplifier gain level substantially constant.

6 Claims, 3 Drawing Sheets

CONSTANT GAIN AMPLIFIER SYSTEM WITH GAIN CONTROL FEEDBACK

CROSS-REFERENCE TO RELATED APPLICATIONS

The benefits of filing this invention as Provisional application for patent "Constant gain amplifier system with gain control feedback", U.S. PTO 61/281,945 filed Nov. 24, 2009 by Fred Mirow are claimed.

BACKGROUND OF THE INVENTION

This invention relates to systems for providing a constant and accurate signal gain with relatively wide bandwidth based on an signal amplifier with high frequency response having it's gain controlled by a gain control amplifier.

In general, the prior art systems have used negative feedback between the output and input of the signal amplifying circuit for obtaining an accurate constant signal gain. A major problem in such systems has been that to maintain signal amplifier stability the signal amplifier frequency bandwidth needed to be limited to obtain relatively large gain and phase margins.

The present invention overcomes the bandwidth limitation of the negative feedback amplifying circuit by allowing the input signal to be amplified by a separate amplifier (signal amplifier) than the amplifier (gain amplifier) that controls the gain applied to the signal. The gain amplifier can have relatively low frequency response compared to the signal amplifier since amplifier gain changes are normally slow in comparison. The gain amplifier compares the input signal level to a signal proportional to the signal amplifier output signal level to obtain a gain control signal. This gain control signal is applied as negative feedback to control the gain applied to the input signal. Thus the present invention does not have the same limited frequency bandwidth requirements to maintain large gain and phase margins.

An objective of the present invention is to provide a constant and accurate signal gain system that has a high temperature, radiation, and voltage stability due to its reliance on passive component ratios to set circuit gain values. Passive components such as resistors and capacitors are more stable under these conditions. This invention increases system accuracy by making the accuracy dependent on passive component ratios instead of transistor stability.

Another object of the invention is to provide bandwidth improvement in constant gain signal amplifiers.

A further objective of the invention to provide circuits that are less susceptible to process variances by relying on impedance ratios thereby providing a more consistently manufacturable circuit.

BRIEF SUMMARY OF THE INVENTION

This invention relates to systems for providing a constant and accurate signal gain with relatively wide bandwidth based on an amplifier with high frequency response having it's gain controlled by a amplifier that may have lower high frequency response.

The present invention overcomes the bandwidth limitation of the negative feedback amplifying circuit by allowing the input signal to be amplified by a separate amplifier (the signal amplifier) than the amplifier (gain amplifier) that controls the gain applied to the signal. The gain amplifier can have relatively low frequency response compared to the signal amplifier since amplifier gain changes are normally slow, for example in the order of milliseconds, and the input signal frequency response is not effected. The gain amplifier compares the input signal level to a signal proportional to the signal amplifier output signal level to obtain an gain control signal. This gain control signal is applied as negative feedback to control the gain applied to the input signal. Reducing the frequency response in the negative feedback loop, which includes the gain amplifier, by using one dominate RC low pass filter has the advantageous effects of increasing stability and reducing the effects of noise. Thus the present invention does not have for the signal amplifier the same limited frequency bandwidth requirements to maintain large gain and phase margins.

The signal amplifier is normally set to a signal gain below it's maximum value under all conditions to allow the actual signal gain to be kept constant. When using a gain amplifier with a high gain level, the actual input signal gain is substantially determined by the ratio of the signal amplifier output signal level to the signal responsive to the signal amplifier output signal level applied to the gain amplifier input.

The signal responsive to the signal amplifier output signal level is optimally obtained by using a resistor divider network in which the resistor temperature and voltage characteristics are matched. By using resistors that are substantially identical except for resistance values the environmental changes have substantially no effect on the output signal level.

There are many well known methods for implementing the signal amplifier gain varying elements. One method is to use signal controlled variable impedance devices. Some examples for use with voltage control signals are variable resistors obtained by using a FET with it's gate receiving the gain control signal. Likewise there are many well known methods for obtaining signal controlled variable gain devices. An example of this are transistors. The transistor's gain is varied by varying it's DC operating current level in response to the gain control signal thus obtaining a signal controlled variable gain device.

In some systems the signal amplifier's input offset voltage also needs to be cancelled along with maintaining constant signal gain. This is accomplished by adding well known offset cancellation techniques such as auto zero to the systems for providing a constant and accurate signal gain. Also, in some situations it is understood that the signal amplifier's gain level maybe less than unity.

BRIEF DESCRIPTION OF THE DRAWINGS

Reference will be made in detail to embodiments of the invention, examples of which are illustrated in the accompanying drawings. The drawings are intended to be illustrative, not limiting. Although the invention will be described in the context of these embodiments, it should be understood that it is not intended to limit the spirit and scope of the invention to these particular embodiments.

DETAILED DESCRIPTION OF THE INVENTION

Figure 1:
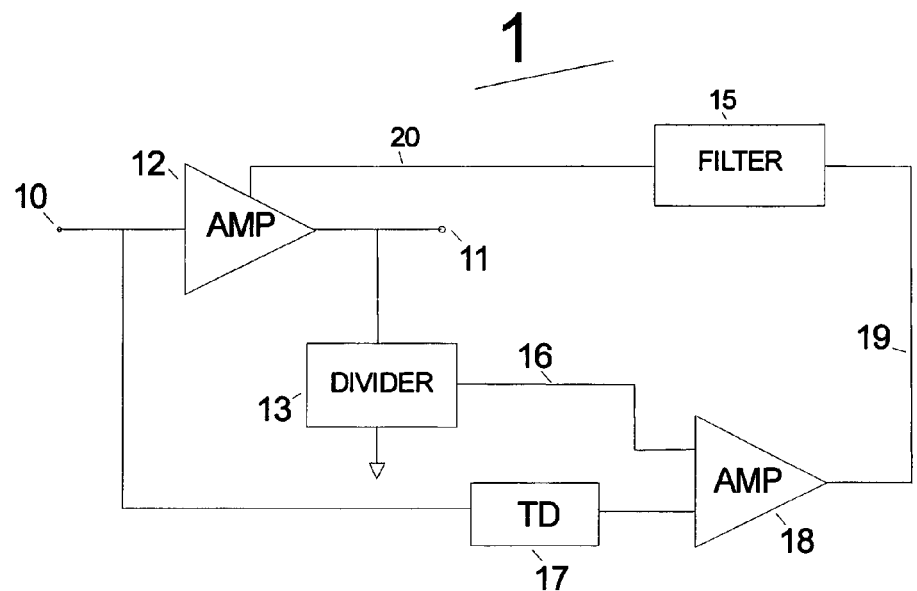
FIG. 1 shows a block diagram of constant gain amplifier system 1.

An embodiment of the invention is shown in FIG. 1. The constant gain amplifier system 1 comprising signal amplifier 12, time delay 17, voltage divider 13, gain amplifier 18, filter 15, input terminal 10 and output terminal 11. Signal amplifier 12 signal input is connected to terminal 10 and the signal output is at output terminal 11. Signal amplifier 12 receives it's gain control signal on line 20. Gain amplifier 18 is a differential amplifier that provides a output signal on line 19 which is responsive to the difference between it's two input signals. Filter 15 receives the signal on line 19 and provides reduced high frequency and noise signal on line 20. Gain amplifier 18 has one input connected to line 16 and the other connected to the output of time delay 17. The input of time delay 17 is connected to input terminal 10. the other end of line 16 is connected to the output of voltage divider 13. The input of voltage divider 13 is connected to output terminal 11.

Signal amplifier 12 applies gain to the input signal connected to terminal 10 and the signal output is at output terminal 11. Signal amplifier 12 gain level is controlled by the gain control signal level on line 20. The input signal is also connected to the input of time delay 17.

The signal output at output terminal 11 is also applied to the input of voltage divider 13 which provides at it's output a signal that is substantially identical it's input except in level. Gain amplifier 18 amplifies the difference between the signal level outputs of time delay 17 and voltage divider 13 to provide a output signal on line 19. The gain control signal on line 19 is applied through filter 15 as negative feedback to signal amplifier 12.

Time delay 17 has a constant signal gain and a time delay preferably equal to the time delay of the input signal though signal amplifier 12. The frequency response of time delay 17 is also preferably similar to that of signal amplifier 12. Time delay 17 is used to insure that the signal received by gain amplifier 18 is substantially identical to the output signal of voltage divider 13 except in level. The Time delay 17 is not needed when the input signal time delay though signal amplifier 12 is not significant in comparison to the frequency response of Gain amplifier 18.

The negative feedback works by causing the signal level on line 19 to change in a direction that causes the input signal gain level of signal amplifier 12 to change so as to keep the signal levels at the two inputs of gain amplifier 18 substantially equal. The actual applied signal gain is substantially set by the combination of the signal level ratio of the input to output of voltage divider 13 and also the signal level ratio of the input to output of time delay 17, if time delay 17 is used.

Figure 2:
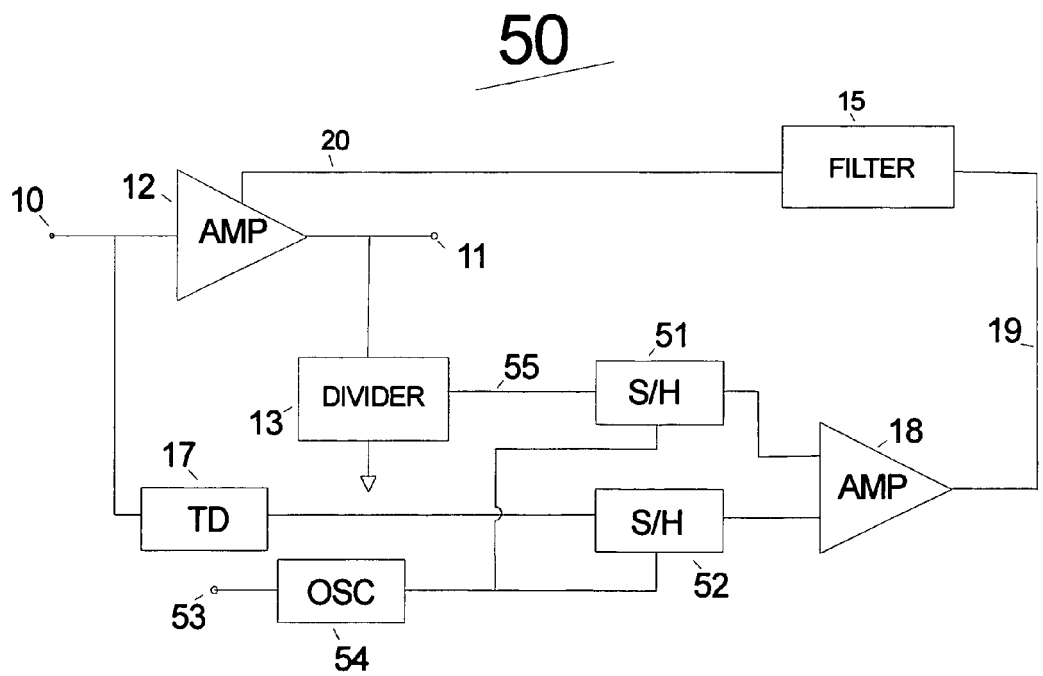
FIG. 2 shows a block diagram of constant gain network system 50.

An other embodiment of the invention is shown in FIG. 2. The constant gain network system 50 comprising signal amplifier 12, time delay 17, voltage divider 13, gain amplifier 18, sample/hold 51, sample/hold 52, oscillator 54, input terminal 53, filter 15, input terminal 10 and output terminal 11. Signal amplifier 12 signal input is connected to terminal 10 and the signal output is at output terminal 11. Signal amplifier 12 receives it's gain control signal on line 20. Gain amplifier 18 is a differential amplifier that provides a output signal on line 19 which is responsive to the amplified difference between it's two input signals. Filter 15 receives the signal on line 19 and provides reduced high frequency and noise signal on line 20. Gain amplifier 18 has one input connected to the output of sample/hold 51, and the other connected to the output of sample/hold 52. The input to sample/hold 52 is connected the output of time delay 17. The input of time delay 17 is connected to input terminal 10. The input to sample/hold 51 on line 55 is connected the output of voltage divider 13. The input of voltage divider 13 is connected to output terminal 11. Oscillator 54 output is connected to the control input of sample/hold 51 and sample/hold 52. Oscillator 54 input is connected to input terminal 53.

Signal amplifier 12 applies gain to the input signal connected to terminal 10 with the signal output at output terminal 11. Signal amplifier 12 gain level is controlled by the gain control signal level on line 20. The input signal is also connected to the input of time delay 17. The output of time delay 17 connected to Sample/hold 52.

Time delay 17 has a constant signal gain and a time delay preferably equal to the time delay of the input signal though signal amplifier 12. The frequency response time delay 17 is also preferably similar to that of signal amplifier 12. Time delay 17 is used to insure that the signal received by sample/hold 52 is substantially identical to the signal output of voltage divider 13 except in level. Time delay 17 is not needed when the input signal time through signal amplifier 12 is not significant in comparison to the frequency response of sample/hold 51 and sample/hold 52.

The signal output at output terminal 11 is also applied to the input of voltage divider 13 which provides at it's output a signal that is substantially identical it's input except in level. The output of voltage divider 13 is connected to Sample/hold 51. Sample/hold 51 and sample/hold 52 are substantially identical. Gain amplifier 18 amplifies the signal level difference between the outputs of Sample/hold 51 and sample/hold 52 to provide a output signal on line 19. The gain control signal on line 19 is applied through filter 15 as negative feedback to signal amplifier 12.

Oscillator 54 can either be an astable or monstable oscillator. When it is a monstable oscillator the signal at input terminal 53 controls when Oscillator 54 produce an active output signal. Oscillator 54 output is connected to the control input of sample/hold 51 and sample/hold 52. When Oscillator 54 produce an active output signal, sample/hold 51 and sample/hold 52 both store their input signals which is also applied to their output. When Oscillator 54 does not have an active output signal, sample/hold 51 and sample/hold 52 both are in hold mode. In hold mode the last level of the sampled signal is held substantially constant at their outputs. The duty cycle of the sample to hold times and their time duration is selected to be appropriate for the frequency response of amplifier 18.

The negative feedback works by causing the signal level on line 19 to change in a direction that causes the input signal gain level of signal amplifier 12 to change so as to keep the signal levels at the two inputs of gain amplifier 18 substantially equal. The actual applied signal gain level is substantially set by the combination of signal level ratio of both the input to output of voltage divider 13 and the signal level ratio of the input to output of time delay 17, if time delay 17 is used.

Figure 3:
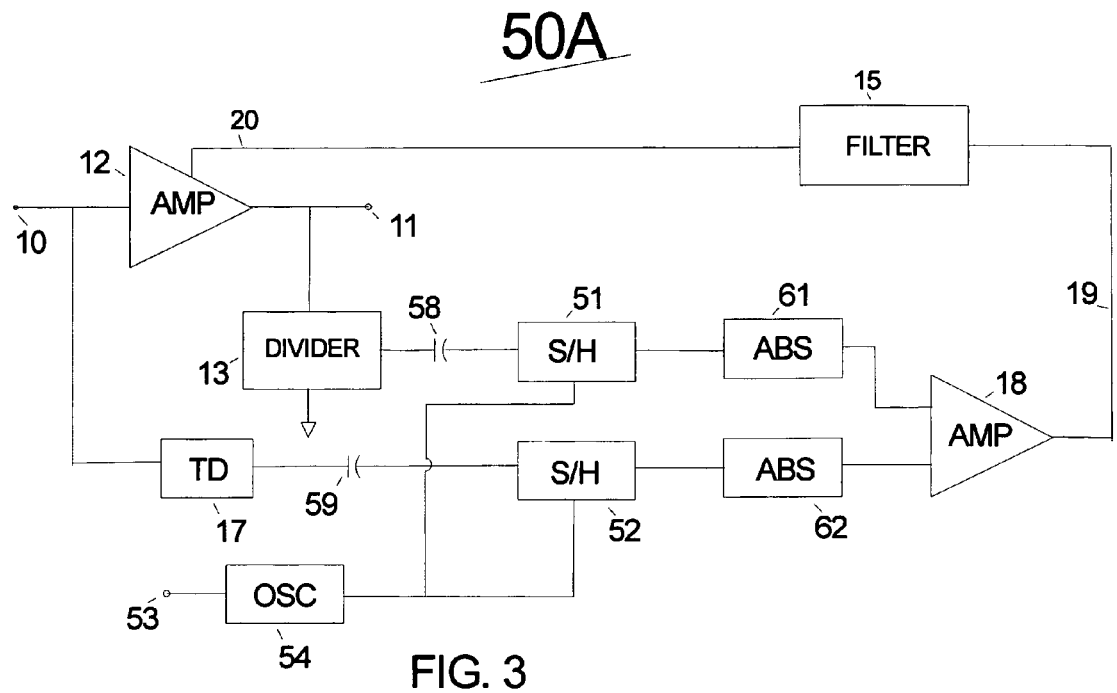
FIG. 3 shows a block diagram of constant AC gain network system 50A.

An other embodiment of the invention is shown in FIG. 3. constant gain network system 50A in which only the AC component of the input signal is used for gain control. This is useful in situation when the output signal has a DC offset voltage from the input signal and in cases where gain is only applied to the AC component of the input signal. The constant gain network system 50A comprising signal amplifier 12, time delay 17, voltage divider 13, gain amplifier 18, filter 15, sample/hold 51, sample/hold 52, oscillator 54, capacitor 58, capacitor 59, absolute value converter 61, absolute value converter 62, input terminal 53, input terminal 10 and output terminal 11. Signal amplifier 12 signal input is connected to terminal 10 and the signal output is at output terminal 11. Signal amplifier 12 receives it's gain control signal from gain amplifier 18 through filter 15. Gain amplifier 18 is a differential amplifier that provides a output signal on line 19 which is responsive to the amplified difference between it's two input signals. Gain amplifier 18 has one input connected to the output of absolute value converter 61, and the other connected to the output of absolute value converter 62. Absolute value converter 61 input is connected to the output of sample/hold 51. Absolute value converter 62 input is connected to the output of sample/hold 52. The input to sample/hold 52 is connected through capacitor 59 to the output of time delay 17. The input of time delay 17 is connected to input terminal 10. The input to sample/hold 51 on line 55 is connected through capacitor 58 to the output of voltage divider 13. The input of voltage divider 13 is connected to output terminal 11. Oscillator 54 output is connected to the control input of sample/hold 51 and sample/hold 52. Oscillator 54 input is connected to input terminal 53.

Signal amplifier 12 applies gain to the input signal connected to terminal 10 and the signal output is at output terminal 11. The input signal is also connected to the input of time delay 17. The output of time delay 17 connected through capacitor 59 to Sample/hold 52.

Time delay 17 has a constant signal gain and a time delay preferably equal to the time delay of the input signal though signal amplifier 12. The frequency response time delay 17 is also preferably similar to that of signal amplifier 12. Time delay 17 is not needed when the input signal time through signal amplifier 12 is not significant in comparison to the frequency response of sample/hold 51 and sample/hold 52. Time delay 17 is used to insure that the signal received by sample/hold 52 is substantially identical to the signal received by sample/hold 51 except for signal level.

The signal output at output terminal 11 is also applied to the input of voltage divider 13 which provides at it's output a signal that is substantially identical it's input except in level. The output of voltage divider 13 is connected through capacitor 58 to Sample/hold 51. Sample/hold 51 and sample/hold 52 are substantially identical. Absolute value converter 61 and absolute value converter 62 convert the magnitude of Sample/hold 51 and sample/hold 52 output signals to their absolute values. Gain amplifier 18 amplifies the difference between the signal level outputs of absolute value converter 61 and absolute value converter 62 to provide a output signal on line 19. The gain control signal on line 19 is applied through filter 15, as negative feedback to signal amplifier 12.

Oscillator 54 can either be an astable or monstable oscillator. When it is a monstable oscillator the signal at input terminal 53 control when Oscillator 54 produces an active output signal. Oscillator 54 output is connected to the control input of sample/hold 51 and sample/hold 52. When Oscillator 54 produce an active output signal, sample/hold 51 and sample/hold 52 both sample their input signals. When Oscillator 54 does not have an active output signal, sample/hold 51 and sample/hold 52 both are in hold mode. In hold mode, the last level of the signal sample is held substantially constant at their outputs. The duty cycle of the sample to hold times and their time duration is selected to be appropriate for the frequency response of amplifier 18, absolute value converter 61 and absolute value converter 62.

The negative feedback works by causing the signal level on line 19 to change in a direction that causes the input signal gain level of signal amplifier 12 to change so as to keep the signal levels at the two inputs of gain amplifier 18 substantially equal. The actual applied signal gain level is substantially set by the signal level ratio of both the input to output of voltage divider 13 and the signal level ratio of the input to output of time delay 17, if time delay 17 is used.

It is understood that the best circuit location of capacitor 59 and capacitor 58 can vary depending on DC voltage levels and the actual DC offset properties of time delay 17, and sample/hold 51 and sample/hold 52. Additional capacitors may be used as needed.

Figure 4:
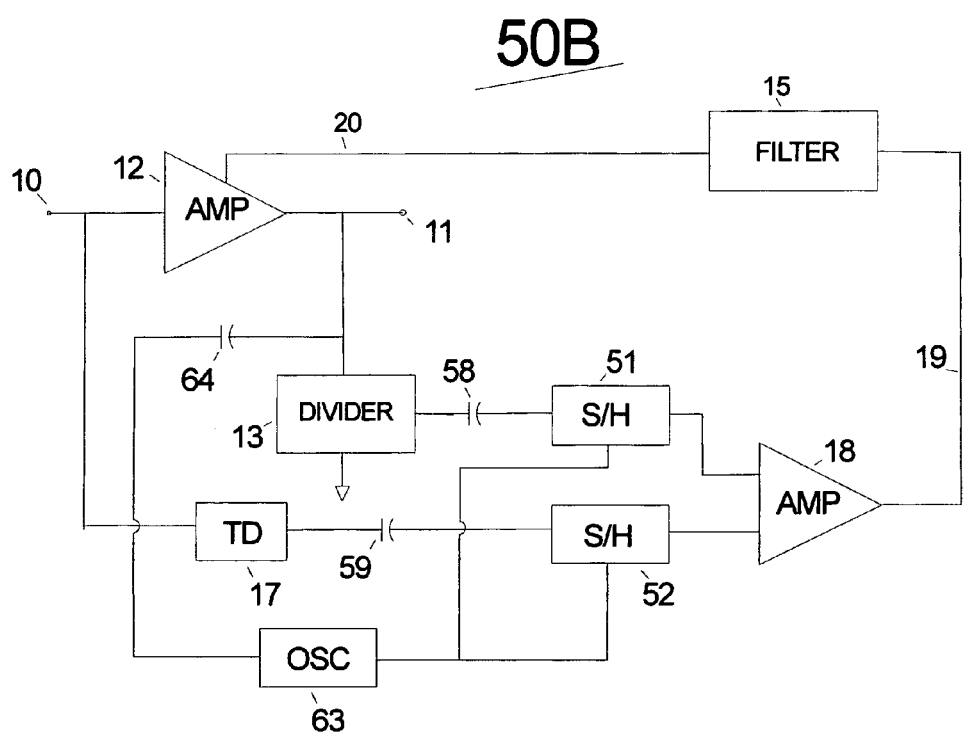
FIG. 4 shows a block diagram of constant AC gain network system 50B.

An other embodiment of the invention is shown in FIG. 4. constant gain network system 50B in which only the AC component of the input signal is used for gain control. This is useful in situation when the output signal has a DC offset voltage from the input signal and in cases where gain is only applied to the AC component of the input signal. The constant gain network system 50B comprising signal amplifier 12, time delay 17, voltage divider 13, gain amplifier 18, filter 15, sample/hold 51, sample/hold 52, oscillator 63, capacitor 58, capacitor 59, capacitor 64, input terminal 10 and output terminal 11. Signal amplifier 12 signal input is connected to terminal 10 and the signal output is at output terminal 11. Signal amplifier 12 receives it's gain control signal from Gain amplifier 18 through filter 15. Gain amplifier 18 is a differential amplifier that provides a output signal which is responsive to the amplified difference between it's two input signals. Gain amplifier 18 has one input connected to the output of sample/hold 51, and the other connected to the output sample/hold 52. The input to sample/hold 52 is connected through capacitor 59 to the output of time delay 17. The input of time delay 17 is connected to input terminal 10. The input to sample/hold 51 on line 55 is connected through capacitor 58 to the output of voltage divider 13. The input of voltage divider 13 is connected to output terminal 11. Oscillator 54 output is connected to the control input of sample/hold 51 and sample/hold 52. Oscillator 54 input is connected through capacitor 64 to output terminal 11.

Signal amplifier 12 applies gain to the input signal connected to terminal 10 and the signal output is at output terminal 11. The input signal is also connected to the input of time delay 17. The output of time delay 17 connected through capacitor 59 to Sample/hold 52.

Time delay 17 has a constant signal gain and a time delay preferably equal to the time delay of the input signal though signal amplifier 12. The frequency response time delay 17 is also preferably similar to that of signal amplifier 12. Time delay 17 is not needed when the input signal time through signal amplifier 12 is not significant in comparison to the frequency response of sample/hold 51 and sample/hold 52. Time delay 17 is used to insure that the signal received by sample/hold 52 is substantially identical to the signal received by sample/hold 51 except for signal level.

The signal output at output terminal 11 is also applied to the input of voltage divider 13 which provides at it's output a signal that is substantially identical it's input except in level. The output of voltage divider 13 is connected through capacitor 58 to Sample/hold 51. Sample/hold 51 and sample/hold 52 are substantially identical. Gain amplifier 18 amplifies the difference between the signal level outputs of Sample/hold 51 and sample/hold 52 to provide a output signal on line 19. The gain control signal on line 19 is applied through filter 15 as negative feedback to signal amplifier 12.

Oscillator 63 is a monstable oscillator that is trigged when the signal output of capacitor 64 goes to a selected polarity and level, for example positive 10 millivolts. When trigged Oscillator 63 produces an active output signal. Oscillator 63 output is connected to the control input of sample/hold 51 and sample/hold 52. When Oscillator 63 produces an active output signal sample/hold 51 and sample/hold 52 both sample their input signals. When oscillator 63 does not have an active output signal sample/hold 51 and sample/hold 52 both are in hold mode. In hold mode, the last level of the signal sample is held substantially constant at their outputs. The active signal time duration is selected to be appropriate for the frequency response of sample/hold 51, and sample/hold 52.

The negative feedback works by causing the signal level on line 19 to change in a direction that causes the input signal gain level of signal amplifier 12 to change so as to keep the signal levels at the two inputs of gain amplifier 18 substantially equal. The actual applied signal gain level is substantially set by the signal level ratio of both the input to output of voltage divider 13 and the signal level ratio of the input to output of time delay 17, if time delay 17 is used.

Figure 5:
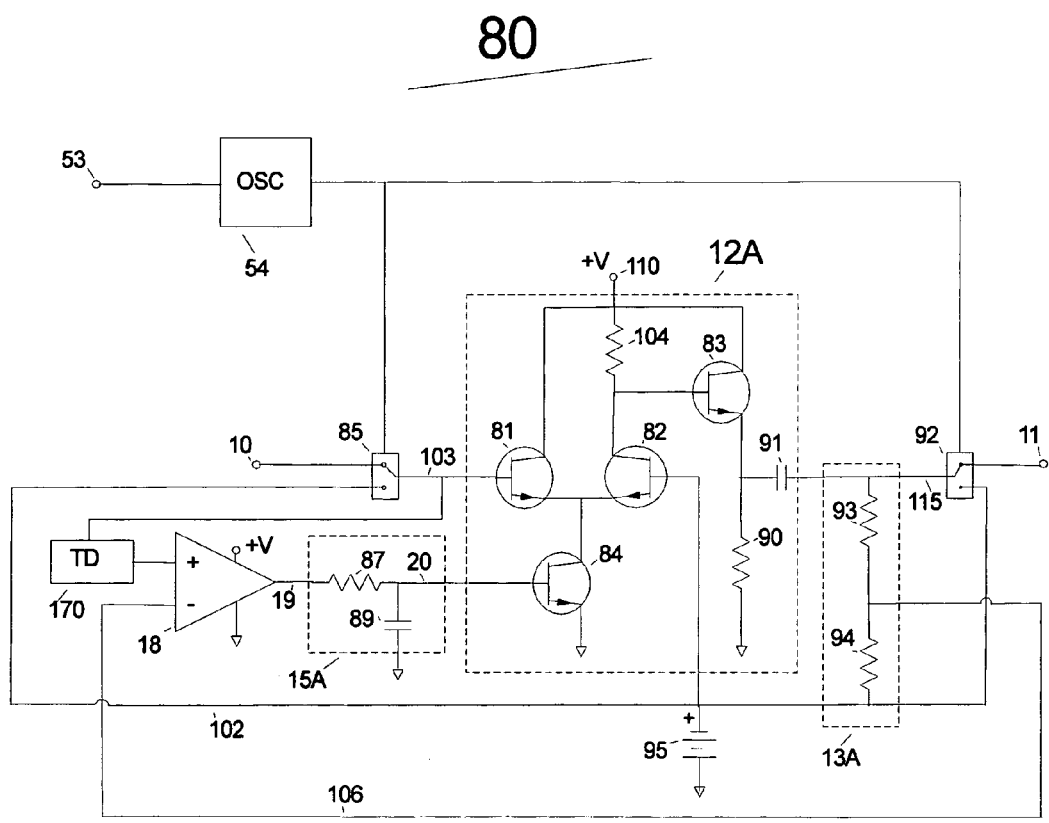
FIG. 5 shows a diagram of constant DC gain network system 80.

An other embodiment of the invention using auto zero is shown in FIG. 5. The constant DC gain network system 80 comprising signal amplifier 12A, time delay 170, voltage divider 13A, gain amplifier 18, filter 15A, voltage reference 95, SPDT switch 85, SPDT switch 92, oscillator 54, input terminal 53, voltage supply input terminal 110, input terminal 10, and output terminal 11.

The power to operate signal amplifier 12A is received at voltage supply input terminal 110. Signal amplifier 12A applies gain to the input signal on line 103 and the signal output is on line 115. The gain level of signal amplifier 12A is controlled by the gain control signal level on line 20.

Oscillator 54 receives a control signal from input terminal 53. SPDT switch 85 and SPDT switch 92 receive their control signal from oscillator 54. When oscillator 54 output signal is high SPDT switch 85 connects line 103 to input terminal 10 and SPDT switch 92 connects line 115 to output terminal 11. When oscillator 54 output signal is low SPDT switch 85 and SPDT switch 92 connect both line 103 and line 115 to line 102.

Time delay 170 has a constant signal gain with substantially zero DC offset voltage level between it's input and output signal. In addition time delay 170 has a time delay preferably equal to the time delay of the input signal though signal amplifier 12A. The frequency response of time delay 170A is also preferably similar to that of signal amplifier 12A. Time delay 170 is used to insure that the signal received by gain amplifier 18 is substantially identical to the output signal of voltage divider 13A except in level. The Time delay 170 is not needed when the input signal time delay though signal amplifier 12A is not significant in comparison to the frequency response of Gain amplifier 18. Time delay 170 input is on line 103.

Gain amplifier 18 is a differential amplifier that provides a output signal on line 19 which is responsive to the difference between it's two input signals. One input is connected to the output of time delay 170 and the other line 106.

Filter 15A is a low pass filter that receives the signal on line 19 and provides a signal on line 20 with reduced high frequency and noise. Filter 15A consist of resistor 87 and capacitor 89. One side of resistor 87 is connected to line 19. The other side of resistor 87 is connected to capacitor 89 and line 20. The other side of capacitor 89 is connected to ground.

Voltage divider 13A provides at it's output a signal that is substantially identical to it's input except in level. It consist of one end of resistor 93 connected to line 115 and the other end connected to line 106 and resistor 94. The other end of resistor 94 is connected to ground.

Signal amplifier 12A has a differential amplifier input stage that drives a emitter follower output stage. The differential amplifier input stage is responsive to the difference between it's two input signals. One input is connected to line 103 and the other to line 102 which is also connected to the DC reference voltage 95. The emitter follower output stage provides the output signal to line 92 through capacitor 91. The operation of these circuits are well known to those practicing the art. The base of transistor 81 is connected to line 103 and the base of transistor 82 is connected to line 102. The emitter of both transistor 81 and transistor 82 are connected to the collector of transistor 84. The base of transistor 84 is connected to line 20. The emitter of transistor 84 is connected to ground. The collector of transistor 81 and transistor 83 are connected to voltage supply input terminal 110. The collector of transistor 82 is connected to the base of transistor 83 and one side of resistor 104. The other side of resistor 104 is connected to voltage supply input terminal 110. The emitter of transistor 83 is connected to one side of resistor 90 and capacitor 91. The other side of resistor 90 is connected to ground and capacitor 91 to line 115.

The constant DC gain network system 80 performs auto zero by using two modes of operation which are controlled by the oscillator 54 output signal level. Amplify mode operation is when oscillator 54 output signal is high. Offset zero mode operation is when oscillator 54 output signal is low. During amplify mode operation SPDT switch 85 connects line 103 to input terminal 10 and SPDT switch 92 connects line 115 to output terminal 11. The input terminal 10 signal is amplified and applied to output terminal 11.

During offset zero mode operation SPDT switch 85 and SPDT switch 92 are both connected to line 102. This places a voltage across capacitor 91 that substantial cancels the amplifier 12A offset voltage so that when operating in the amplify mode, the voltage level between output terminal 11 and line 102 is reduced towards zero when the voltage levels on line 102 and input terminal 10 are equal.

During amplify mode operation the signal gain between input terminal 10 and output terminal 11 is kept relatively constant by using negative feedback. The negative feedback works by causing the signal level on line 19 to change in a direction that causes the input signal gain level of signal amplifier 12A to change so as to keep the signal levels at the two inputs of gain amplifier 18 substantially equal. The actual applied signal gain is substantially set by the combination of the signal level ratio of the input to output of voltage divider 13A and also the signal level ratio of the input to output of time delay 170, if time delay 170 is used.

Although the above description has been directed to preferred embodiments of the invention, it will be understood and appreciated by those skilled in the art that other variations and modifications may be made without departing from the spirit and scope of the invention, and therefore the invention includes the full range of equivalents of the features and aspects set forth in the appended claims.

I claim:

1. A constant signal gain system that applies gain to an externally applied voltage input signal to produce an output signal in which the level variation of said gain is reduced, comprising:
   a signal amplifier for providing said gain;
   a gain amplifier for providing a gain control signal with level of said gain control signal responsive to the difference in signal level between a signal responsive to said externally applied voltage input signal and a negative feedback signal;
   a time delay providing time delay between said input signal and said signal responsive to said input signal substantially equal to the time delay between said input signal and said negative feedback signal;
   said negative feedback signal having level responsive to said output signal level;
   a filter limiting said gain control signal frequency bandwidth less than said signal amplifier frequency bandwidth;
   said signal amplifier gain level responsive to level of said gain control signal;
   whereby level variation of said gain applied to said externally applied voltage input signal is reduced by maintaining said signal responsive to said externally applied voltage input signal and said negative feedback signal levels substantially equal.

2. The invention of claim 1 further comprises apparatus to reduce input offset voltage level of said signal amplifier.

3. The invention of claim 2 wherein said apparatus too reduce input offset voltage level of said signal amplifier uses auto zero.

4. A constant signal gain system that applies gain to an externally applied input signal to produce an output signal in which the level variation of said gain is reduced, comprising:
   a signal amplifier for providing said gain;
   first sample/hold for receiving signal responsive to said externally applied input signal;
   second sample/hold for receiving signal responsive to said output signal;
   said first and second sample/hold both having a hold mode and sample mode;
   when in said sample mode said first sample/hold stores signal responsive to said externally applied input signal;
   when in said sample mode said second sample/hold stores signal responsive to said output signal;
   when in said hold mode the last level of the signal responsive to said externally applied input signal is held substantially constant at said first sample/hold output;
   when in said hold mode the last level of the signal responsive to said output signal is held substantially constant at said second sample/hold output;
   a gain amplifier for providing a gain control signal;
   said gain amplifier is responsive to the difference in signal level between a signal responsive to said first sample/hold output and a signal responsive to said second sample/hold output;
   said signal amplifier gain level responsive to level of said gain control signal; and
   whereby level variation of said gain applied to said externally applied input signal is reduced by maintaining said signal responsive to said externally applied input signal and said negative feedback signal levels substantially equal.

5. The invention of claim 4 further comprising a time delay in signal path between said externally applied input signal and said gain amplifier input receiving said signal responsive to said first sample/hold output.

6. The invention of claim 1 in which said gain amplifier for providing said gain control signal with level of said gain control signal responsive to the difference in AC signal level between a signal responsive to said externally applied input signal and a signal responsive to said output signal.

* * * * *